(12) United States Patent
Furusawa et al.

(10) Patent No.: US 6,220,935 B1
(45) Date of Patent: *Apr. 24, 2001

(54) APPARATUS AND METHOD FOR CLEANING SUBSTRATE

(75) Inventors: Masami Furusawa, Kawasaki; Riichiro Harano, Kanagawa-ken, both of (JP)

(73) Assignee: Sprout Co., Ltd., Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/132,246

(22) Filed: Aug. 11, 1998

(30) Foreign Application Priority Data

Aug. 12, 1997 (JP) .................................... 9-230252
Mar. 6, 1998 (JP) .................................... 10-054633

(51) Int. Cl.$^7$ .................................... B24C 1/00
(52) U.S. Cl. .................... 451/38; 451/39; 451/60; 451/75; 451/80; 451/89; 134/2
(58) Field of Search .................. 451/38–40, 89, 451/80, 60, 125, 91

(56) References Cited

U.S. PATENT DOCUMENTS

| | | | |
|---|---|---|---|
| 5,367,838 | * 11/1994 | Visaisouk et al. | 451/39 |
| 5,512,106 | * 4/1996 | Tamai et al. | 134/7 |
| 5,651,834 | * 7/1997 | Jon et al. | 134/31 |
| 5,836,809 | * 11/1998 | Kosic | 451/89 |
| 5,839,945 | * 11/1998 | Elliot | 451/82 |
| 5,961,732 | * 10/1999 | Patrin et al. | 134/7 |
| 5,989,355 | * 11/1998 | Brandt et al. | 134/6 |
| 6,004,400 | * 12/1999 | Bishop et al. | 134/2 |

FOREIGN PATENT DOCUMENTS

| | | |
|---|---|---|
| 5-144793 | 6/1993 | (JP) . |
| 5-144794 | 6/1993 | (JP) . |
| 5-267261 | 10/1993 | (JP) . |
| 7-201795 | 8/1995 | (JP) . |
| 7-256222 | 10/1995 | (JP) . |
| 8-250458 | 9/1996 | (JP) . |
| 9-275086 | 10/1997 | (JP) . |

* cited by examiner

Primary Examiner—Robert A. Rose
Assistant Examiner—George Nguyen
(74) Attorney, Agent, or Firm—Jacobson, Price, Holman & Stern, PLLC

(57) ABSTRACT

The apparatus for cleaning a substrate comprises cleaning chambers each of which is disposed on a respective side with reference to a clearance therebetween. The apparatus further comprises a plurality of chucks which clamp the substrate to be cleaned and move the substrate between the inside the clearance between the cleaning chambers and the outside thereof, a pair of screws each of which is disposed to be rotatable and close to a respective surface of the substrate when the substrate is introduced into the clearance between the cleaning chambers, liquid supplying nozzles which supply the screws with pure water or mixed liquid including pure water and medicinal liquid, and snow ice supplying nozzles which supply the screws with snow ice having a predetermined granular diameter. The opposite surfaces of the substrate are cleaned by rotating pure water or mixed liquid including pure water and medicinal liquid by means of the screws to press it against the opposite surfaces of the substrate.

11 Claims, 3 Drawing Sheets

APPARATUS AND METHOD FOR CLEANING SUBSTRATE

BACKGROUND OF THE INVENTION

1. Field of the Invention

The present invention relates to an apparatus and a method for cleaning a substrate, and in particular, to an apparatus and a method for cleaning a substrate which is applicable to a semi-conducter wafer, a glass substrate for a liquid crystal display (LCD) or for a plasma display panel (PDP), etc.

2. Description of the Related Art

Conventionally, a semi-conducter wafer,and a glass substrate for LCD or PDP has been cleaned mechanically or chemically. More specifically, the substrate has been cleaned by utilizing the combination of a brush, which includes a protruded shape made of PVA, etc., with medicinal liquid and the like. In particular, in a case where the substrate is cleaned after a metallic film and an oxidized film are formed on the substrate, or after the substrate is polished chemically and mechanically, the oxidized film can be etched by a great amount of hydrofluoric acid and then cleaned off. However, in most cases, the substrate has been cleaned by a brush. Further, in a case where a resist residue which remains on the substrate is to be removed after it is ashed, the resist is cleaned off by a mixed liqud of sulfuric acid and another medicinal liquid, while on the other hand, in a case where metallic fractions are to be removed from the oxidized film, the metallic fractions are cleaned off by a mixed liquid of hydrochloric acid and another liquid.

The cleaning of the substrate by the brush causes several kinds of problems, for instance, mechanical damage to the substrate, the need to frequently replace the brush due to the fact that the foreign objects which have entered into, or have been entrapped to the brush cannot be completely removed, and the difficulty in adjusting the degree of parallelization of a line formed by tip of the brush against the surface of the wafer.

Further, in a case where the semi-conducter wafer or the glass substrate is to be cleaned by the brush, rubbish, the foreign objects, or particles can be entrapped into the brush to be attached thereto, which results in the incomplete cleaning of the semi-conducter wafer or the glass substrate.

Furthermore, in a case where the semi-conducter wafer or a glass substrate is to be cleaned without using the brush after CMP, there is a problem that the rubbish, foreign objects, and particles can not be completely removed unless it is etched by a large amount of hydrofluoric acid.

In addition, as described above, the resist after it is ashed is removed by a mixed liquid of sulfuric acid and another medicinal liquid, however, it cannot be removed completely through such a chemical reaction. Therefore, it is removed through some processes in each of which a large amount of medicinal liquid is used, which has the disadvantage of increasing the amount of work.

SUMMARY OF THE INVENTION

It is therefore an object of the present invention to provide an apparatus or a method for cleaning the substrate which is capable of cleaning the substrate very well without using a brush.

It is another object of the present invention to provide an apparatus or a method for cleaning the substrate which is capable of cleaning the substrate to a high degree by completely removing rubbish, etc. without using a large amount of hydrofluoric acid or medicinal liquid.

The above objects are achieved according to the present invention by providing an apparatus for cleaning a substrate comprising cleaning chambers each of which is disposed on a respective side with reference to a clearance therebetween, chuck means for clamping the substrate to be cleaned and moving the substrate between the inside of the clearance between the cleaning chambers and the outside thereof, screw means each of which is disposed to be rotatable and close to a respective surface of the substrate when the substrate is introduced into the clearance between the cleaning chambers, liquid supplying means for supplying the screw means with pure water or mixed liquid including pure water and medicinal liquid; and snow ice supplying means for supplying the screw means with snow ice having a predetermined granular diameter, whereby the opposite surfaces of the substrate are cleaned by the screw means rotating pure water or mixed liquid including pure water and medicinal liquid, and snow ice so as to press it against the opposite surfaces of the substrate.

The above objects are achieved according to the present invention by providing a method for cleaning a substrate to be cleaned in cleaning chambers each of which is disposed on a respective side with reference to a clearance therebetween, the method comprising the steps of moving the substrate toward the clearance between the cleaning chambers, supplying the area close to the opposite surfaces of the substrate with pure water or mixed liquid including pure water and medicinal liquid and snow ice having a predermined granular diameter; and cleaning the opposite surfaces of the substrate by rotating the pure water or mixed liquid including pure water and medicinal liquid, and snow ice to press it against the opposite surfaces of the substrate.

The above objects are achieved according to the present invention by providing a method for cleaning a substrate to be cleaned in cleaningchambers each of which is disposed on a respective side with reference to a clearance therebetween, the method comprising the steps of moving the substrate toward the clearance between the cleaning chambers, supplying the area close to at least one surface of the substrate with pure water or mixed liquid including pure water and medicinal liquid and snow ice having a predetermined granular diameter; and supplying the area close to the one surface of the substrate with the snow ice having a predetermined granular diameter, cleaning the one surface of the substrate by rotating the pure water or mixed liquid including pure water and medicinal liquid, and snow ice to press it against the one surface of the substrate.

BRIEF DESCRIPTION OF THE DRAWINGS

The above and other objects and advantages of the present invention will become apparent from the following description when read in conjunction with the accompanying drawings wherein.

DETAILED DESCRIPTION OF THE PREFERRED EMBODIMENT

The preferred embodiment of the present invention will be hereinafter described with reference to the accompanying drawings.

The present invention is applicable to an apparatus and a method for cleaning a semi-conducter wafer, a glass substrate for a liquid crystal display (LCD) or for a plasma display panel (PDP), etc. Now, the apparatus for cleaning a substrate used after the semi-conducter wafer as the substrate is polished chemically and mechanically, and then ashed will be hereinafter described as the preferred embodiment.

Figure 1:
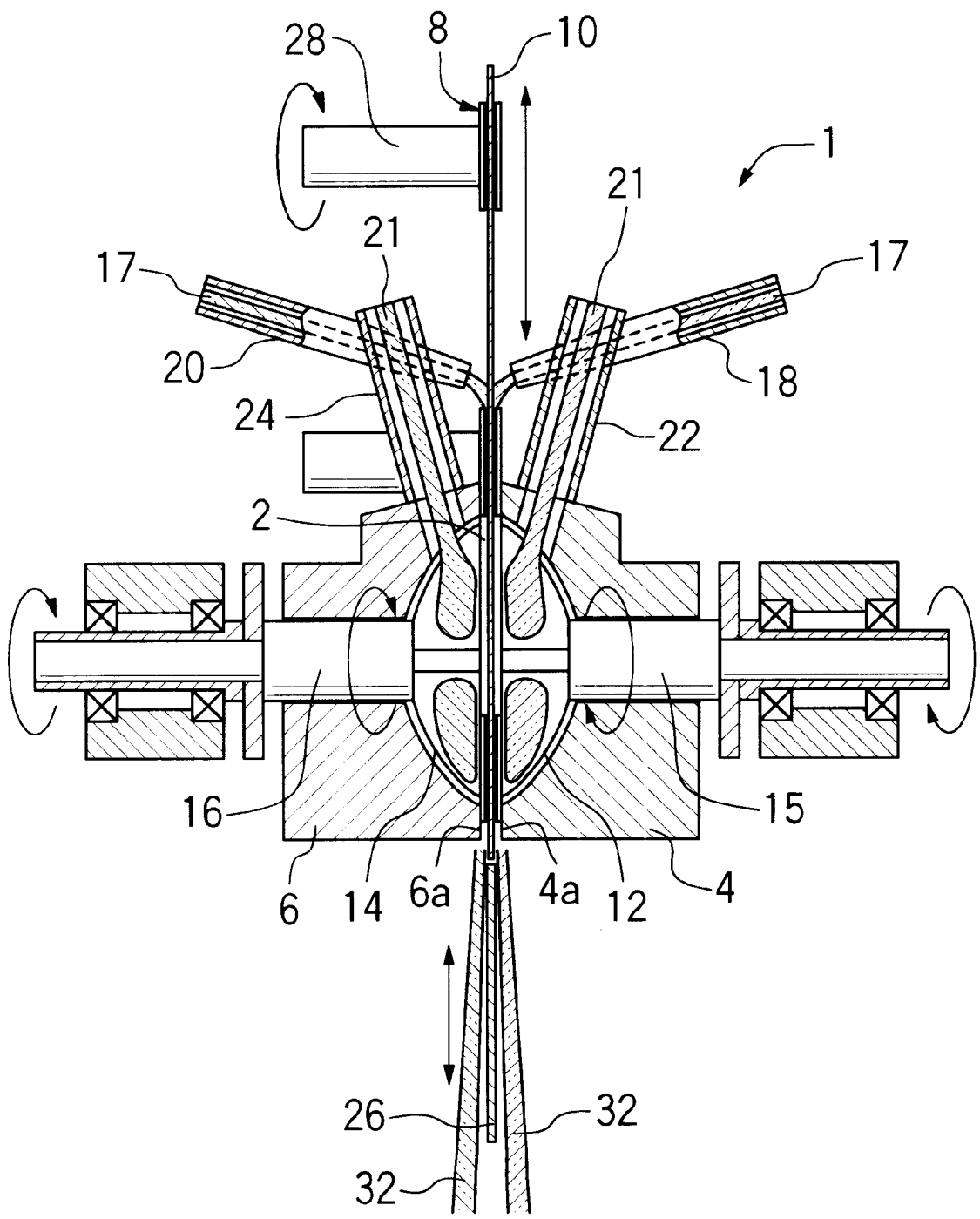
FIG. 1 is a front sectional view of an apparatus for cleaning a substrate according to an embodiment of the present invention.
Figure 2:
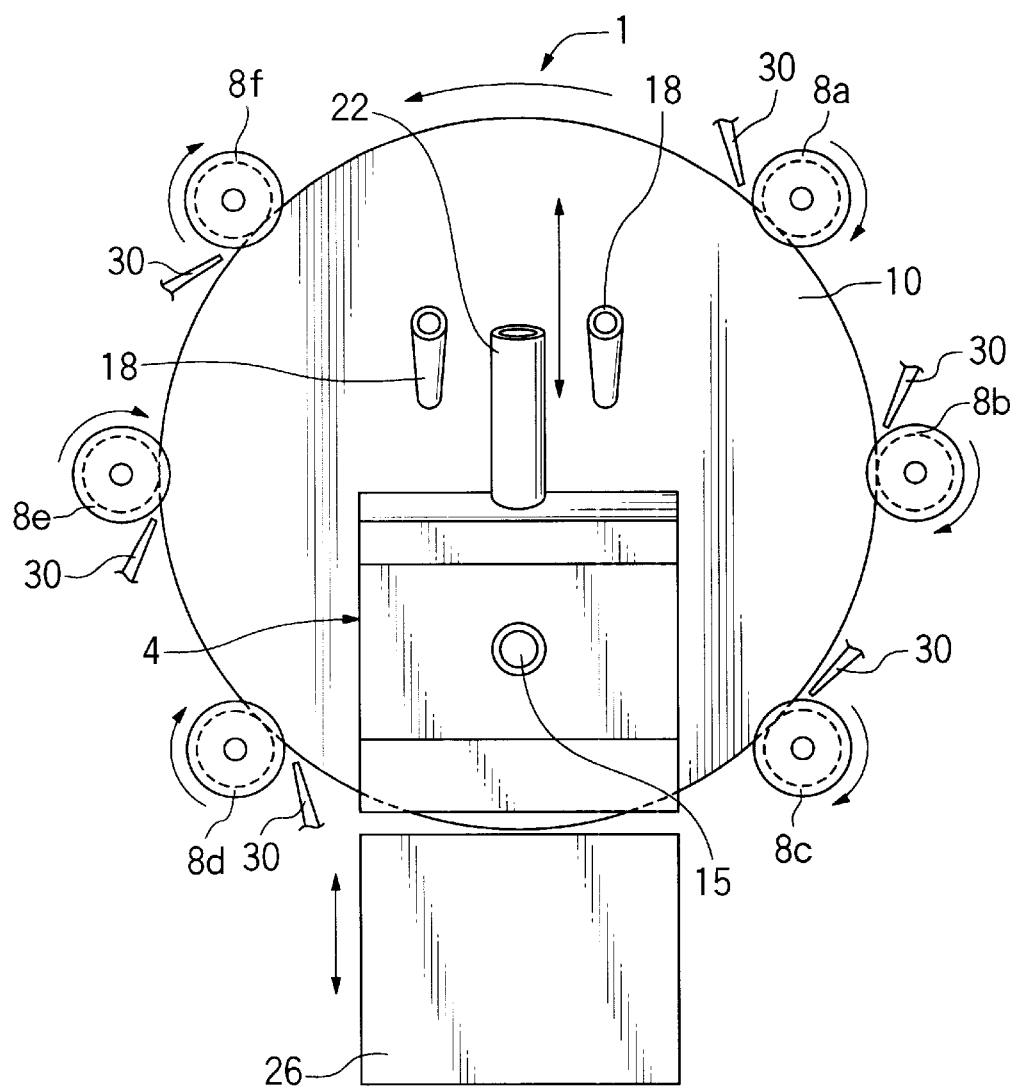
FIG. 2 is a side view of an apparatus for cleaning a substrate according to the embodiment of the present invention.

As shown in FIGS. 1 and 2, a reference numeral 1 indicates the entire apparatus for cleaning the substrate according to the preferred embodiment. The apparatus 1 includes a pair of cleaning chambers 4,6 each of which are disposed laterally with a certain clearance therebetween. Outside of these cleaning chambers 4,6 are provided six chucks 8(8a, 8b, 8c,8d, 8e, 8f), with three chucks being disposed symetrically relative to a vertical line to the other three, as shown in FIG. 2. These chucks 8 are movable up and down, as descibed below, so as to make the substrate 10 (the semi-conducter wafer) move through a clearance 2 between the cleaning chambers 4,6 by lowering it while at the same time clamping it, while on the other hand removing it from the clearance 2 to the outside of the cleaning chambers 4,6 by raising it.

A pair of screws 12,14 each of which includes a plurality of blades are disposed to be close to the respective surfaces of the substrate 10 in the cleaning chambers 4, 6. These screws 12, 14 are connected to rotating shafts 15, 16, respectively, so as to be rotatable by means of a driving source (not shown). In this connection, inner walls 4a, 6a are provided on opposing sides of the cleaning chambers 4,6, respectively, and portions of the inner walls 4a, 6a, which correspond to the positions of the screws 12,14, respectively, are dented outwardly so as to cover the back surfaces of the screws 12,14. In addition, a pair of liquid supply nozzles 18, 20 are provided above the cleaning chambers 4,6, respectively, in order to supply the clearance 2 between the cleaning chambers 4,6 with pure water or mixed liquid 17 including pure water and medicinal liquid. Further, a pair of snow ice supply nozzles 22, 24 to supply the screws 12,14 with snow ice 21 including a certain granular diameter are provided above the cleaning chambers 4,6, respectively.

In addition, a dummy plate 26 which is made of a medicinal liquid corrosion resistant material and has the same thickness as the substrate 10 to be cleaned is disposed below the clearance 2 between the cleaning chambers 4,6. If the substrate 10 is not in the clearance 2 between the cleaning chambers 4,6, this dummy plate 26 is adapted to be raised to be inserted into the clearance 2.

Now, the above-described chucks 8 will be explained in more detail. In this embodiment, as shown in FIG. 2, chucks 8 are disposed symmetrically relative to a vertical line, with one set of three chucks 8a, 8b, and 8c being located on the right side, while another set of three chucks 8d, 8e, and 8f is located on the left side. Each set of these three chucks 8 includes a respective driving source 28 which is independent from the driving source of the other set of three chucks, by which driving sources 28 all six chucks 8 are adapted to be operated in a synchronized way at the same rotating speed. This enables these chucks 8 to be rotated in the same direction, as shown in FIG. 2, thereby causing the substrate 10 to be rotated.

In a case where the substrate is a semi-conducter wafer, this wafer includes orientation flats, or notches. The substrate (semi-conducter wafer) 10 can maintain a stable situation even when one of the notches of the substrate 10 held by the chucks 8 passes over one of the six chucks 8, since it is always held by the five other chucks 8.

In addition, in this embodiment, the three chucks 8a, 8b, 8c on the right side with reference to the clearance 2, for instance, are disposed to be stationary so as to be utilized as a reference for positioning the substrate 10, while on the other hand, the three chucks 8d, 8e, 8f on the left side are provided with a structure including a spring, etc. which can adjust the spring load so that the chucks 8 can hold the substrate 10 without there being any clearance therebetween even when diameter tolerance of the substrate 10 causes a clearance between the chucks 8 and the substrate 10. The spring load ranges from about 0.5 Kg to about 2.0 Kg, and, preferably between 0.5 Kg and 1.0 Kg.

In this connection, these six chucks 8 are disposed on a single base (not shown) which is raised and lowered to move the substrate 10 up and down.

Further, since the substrate 10 is rotated while it is being clamped (held) by the chucks 8, portions of the substrate 10 which contacts the chucks 8 can be contaminated. In this embodiment, in order to solve this problem, medicinal liquid nozzles 30 are provided on positions close to the portions of the substrate 10 which contact the respective chucks 8, respectively, for injecting pure water or medicinal liquid to clean the contacting portions.

Next, the apparatus 40 for producing snow ice and transporting the produced snow ice to snow ice supplying nozzles 22,24 will be explained, with reference to FIG. 3.

Figure 3:
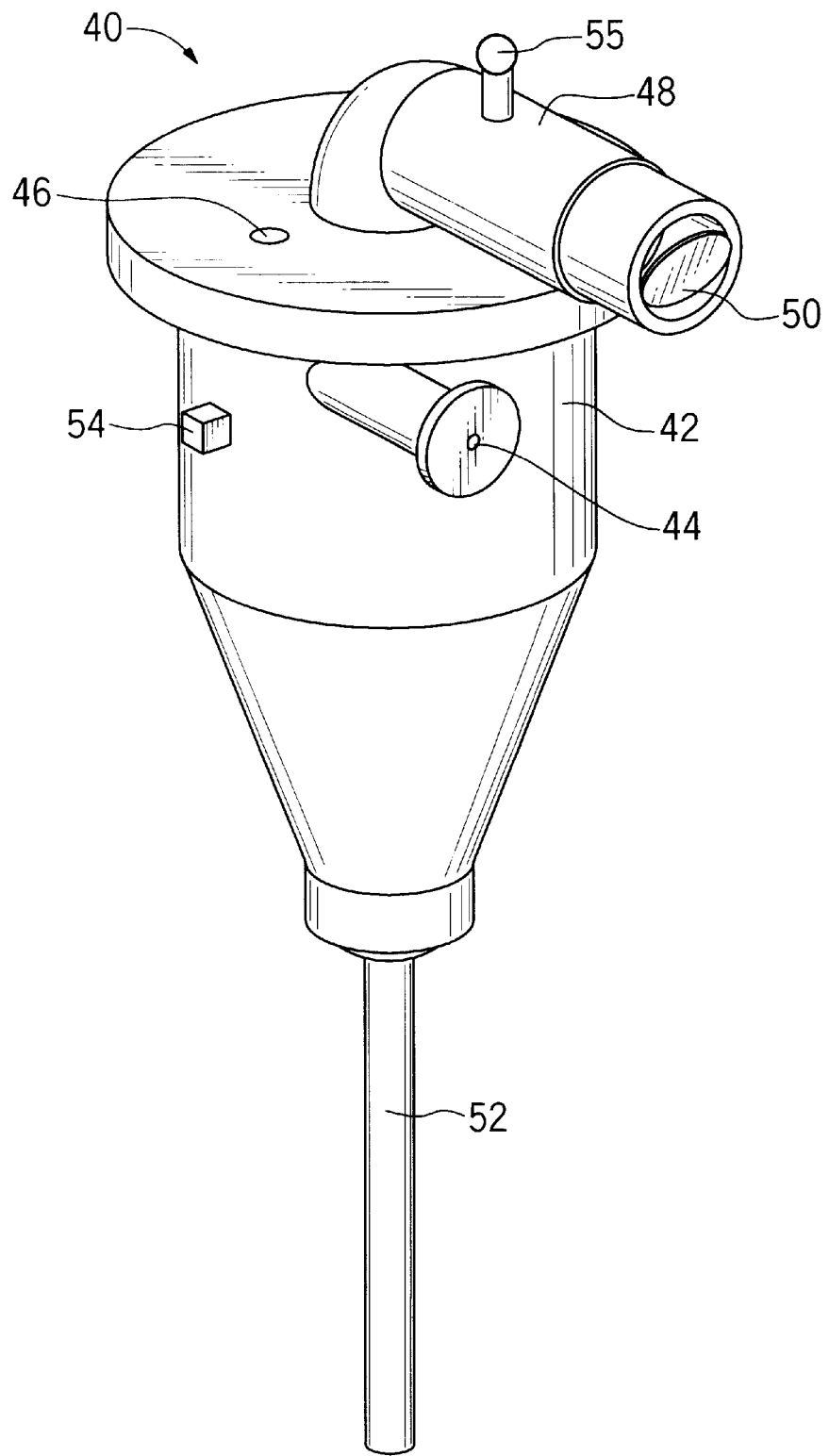
FIG. 3 is a perspective view of an apparatus for producing snow ice used in the embodiment of the present invention.

FIG. 3 is a perspective view of the apparatus 40 for producing snow ice. As shown in FIG. 3, the apparatus 40 for producing snow ice comprises a snow ice chamber 42 the interior of which is thermally insulated, a cooled gas inlet port 44 which causes a cooled gas to flow into the snow ice chamber 42, ultra pure water supply port 46 which supplies interior of the snow ice chamber 42 with ultra pure water, a discharge tube 48 which discharges the cooled gas, a pressure regulating valve 50 which is provided on the discharge tube 48, a tranport tube 52 for transporting produced snow ice to the snow ice supplying nozzles 22, 24, a temperature sensor 54 which measures the temperature inside the snow ice chamber 42, and a pressure detector which detects the pressure in the snow ice chamber 42.

The apparatus 40 for producing snow ice configured in the above manner operates as follows. The interior of the snow ice chamber 42 is adapted so as not to undergo condensation while the apparatus 40 is halted due to the fact that clean dry air or clean dry nitrogen, the temperature of which is close to ambient temperature, is caused to flow from the cooled gas inlet port 44. When the apparatus 40 starts operating, the above-described gas with a close to ambient temperature stops flowing from the cooled gas inlet port 44, the cooled gas of clean 25 dry air or clean dry nitrogen, the temperature of which is between −20° C. and −80° C., is caused to flow into the cooled gas inlet port 44 instead. This cooled gas is injected into the snow ice chamber 42 along its inner wall which has a round tubular shape, and then discharged from the discharge tube 48 while being rotated like a cyclone. When the temperature inside the snow ice chamber 42, which is measured by the temperature sensor 54, is reduced to a predetermined temperature, ultra pure water is sprayed from the ultra pure water supplying port 46. This sprayed ultra pure water, along with the cooled gas, is rotated like a cyclone inside the snow ice chamber 42, whereby latent heat of the sprayed ultra pure water is absorbed by the cooled gas, followed by the phase transition of the ultra pure water into fine granular snow ice. Then, the cooled gas is discharged from the discharge tube 48. The pressure inside the snow ice chamber 42 can be maintained constant by adjusting the angles at which the pressure regulating valve 50 provided on the discharge tube 48 is open and shut, based on the pressure value in the snow ice chamber 42 detected by the pressure detector 55. In addition, Since the pressure inside the snow ice chamber 42 is higher than atmospheric pressure, the pressure differential therebetween enables the snow ice, which is produced in the snow ice chamber 42, to be transported to the snow ice supplying nozzles 22,24 through the tranport tube 52.

Next, the operation of the above-described apparatus 1 for cleaning the substrate and the cleaning method using the apparatus 1 will be explained.

First, the chucks 8 are mounted on the substrate 10. At this stage, the chucks 8, along with the base (not shown), are kept above the cleaning chambers 4,6.

Next, the chucks 8 which clamp the substrate 10 are lowered, whereby the substrate 10 is inserted into the clearance 2 between the cleaning chambers 4,6 to be positioned at the cleaning start level where the cleaning of the substrate 10 is started. Under such circumstances, the speed at which the chucks 8 are raised or lowered can be adjusted from between about 10 mm/min to about 1000 mm/min. In addition, the speed at which the substrate 10 is moved to the cleaning start level or the removing level , as described below, where the substrate 10 is removed is relatively high, that is, from between about 100 mm/min to 1000 mm/min.

Thereafter, as shown in FIG. 2, the substrate 10 is rotated by the rotation of the chucks 8 , while at the same time it is reciprocated upwardly and downwardly by the upward and downward movements of the chucks 8. The number of the rotations of the substrate 10 is from between about 10 rpm to about 60 rpm, while the speed at which the chucks 8 move up and down is relatively low, that is, from between about 30 mm/min to about 500 mm/min.

Further, between the clearance 2 and the respective surfaces of the substrate 10 is supplied with the pure water or mixed liquid 17 including pure water and medicinal liquid from the liquid supply nozzles 18, 20, respectively. In addition, the screws 12, 14 are supplied with snow ice 21 from the snow ice supplying nozzles 22, 24, respectively.

This snow ice 21 is mingled with pure water or the mixed liquid 17 including pure water and medicinal liquid , which is caused to flow down, by the rotation of the screws 12, 14, and then forced out toward the respective surfaces of the substrate 10. During this time, the snow ice 21, which is mingled with pure water or the mixed liquid 17 including pure water and medicinal liquid, cleanes the substrate 10 by scrubing the respective surfaces of the substrate 10.

Upon the substrate 10 being cleaned, the temperature of the pure water or the mixed liquid including pure water and medicinal liquid is adjusted from between about 5° C. to about 30° C. By adjusting the temperature of the pure water or the mixed liquid including pure water and medicinal liquid, the optimum cleaning characteristics can always be attained even when the cleaning conditions fluctuates.

Furthermore, the pressure force at which the snow ice 21 is pressed against the substrate 10 can be adjusted by regulating the amount of the snow ice 21 supplied to the cleaning chambers 4, 6, or the size of the clearance between the cleaning chambers 4, 6 and the substrate 10 and the number of the rotations of the screws 12,14, whereby damage to the substrate 10 can be avoided and the cleaning conditions can be controlled.

Preferably, the clearance between the cleaning chambers 4, 6 and the respective surfaces of the substrate 10 is about 1 mm, however, it may be from about 0.5 mm to about 1.5 mm, since the condition of the snow ice 21 can be changed depending on the temperature of the pure water or the mixed liquid 17 including pure water and medicinal liquid with which the screws 12, 14 are supplied from the liquid supply nozzles 18, 20, respectively.

Preferably, the granular diameter of the snow ice 21 which is fed from the snow ice supplying nozzles 22,24 is from between about 10 $\mu$m to about 20 $\mu$m, and in particular, the best cleaning effect can be obtained in a case of about 50 $\mu$m.

In this way, the opposite surfaces of the substrate are cleaned, and as a result, pure water or mixed liquid 17 including pure water and medicinal liquid, and the snow ice 21 get contaminated. This contaminated pure water or mixed liquid 17 including pure water and medicinal liquid, and the contaminated snow ice 21 are caused to drop downwardly by gravity from the clearance 2 between the cleaning chambers 4,6, as indicated by the numeral reference 32 in FIG. 1.

At this point, the entirety of each of the surfaces of the substrate 10 is continously cleaned since pure water or mixed liquid 17 including pure water and medicinal liquid is constantly fed from the above, while the contaminated pure water or mixed liquid 17 including pure water and medicinal liquid, and the contaminated snow ice 21 are discharged downwardly from the cleaning chambers 4, 6, so that these contaminants are prevented from remaining in the cleaning chambers 4,6.

Finally, in this embodiment, the cleaned substrate 10 is moved upwardly to the removing level by means of the chucks 8. This completes the cleaning of this substrate 10, and then a next substrate is cleaned by the same procedure.

In this embodiment, the dummy plate 26 which is disposed below the cleaning chambers 4,6 is raised to be inserted into the clearance 2 during the time from after the cleaning of a substrate is completed and before the cleaning of a next substrate is started, since no substrate is exist in the clearance 2.

On the other hand, in this embodiment, when a plurality of substrates are to be cleaned one after the other, pure water or mixed liquid 17 including pure water and medicinal liquid, and the snow ice 21 are adapted to be constantly fed. Consequently, the condition of the pure water or mixed liquid 17 including pure water and medicinal liquid, and that of the snow ice 21 can be kept constant, since the dummy plate 26 is raised to be inserted into the clearance 2 during the time from after the cleaning of one substrate is completed and before the cleaning of a next substrate started, that is, a time during which no substrate is in the clearance 2. This enables the overall cleaning efficiency to be improved.

The above-described method for cleaning the substrate is directed to cleaning the opposite surfaces of the substrate 10, however, the present invention is not limited to the above application, as it can also be applied to cleaning only one surface of the substrate, if desired. More specifically, in a case where, for instance, the right-side surface of the substrate 10 is to be cleaned (See FIG. 1), pure water or mixed liquid including pure water and medicinal liquid is supplied from the liquid supplying nozzle 18, and the snow ice is supplied from the snow ice supplying nozzle 22, and then pure water or mixed liquid including pure water and medicinal liquid, and the snow ice are pressed against the surface of the substrate 10 by the rotation of the screw 12, and as a result, the substrate 10 is cleaned physically and chemically.

The present invention may be embodied in other specific forms without departing from the spirit or essential characteristics thereof. The presently disclosed embodiment is therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. An apparatus for cleaning a substrate comprising:

cleaning chambers each of which is disposed on a respective side with reference to a clearance therebetween;

chuck means for clamping the substrate to be cleaned and moving the substrate between the inside of the clearance between the cleaning chambers and the outside thereof;

screw means each of which is disposed to be rotatable and close to a respective surface of the substrate when the substrate is introduced into the clearance between the cleaning chambers;

liquid supplying means for supplying the screw means with pure water or mixed liquid including pure water and medicinal liquid; and snow ice supplying means for supplying the screw means with snow ice having a predetermined granular diameter;

whereby the opposite surfaces of the substrate are cleaned by the screw means rotating pure water or mixed liquid including pure water and medicinal liquid, and snow ice so as to press it against the opposite surfaces of the substrate.

2. The apparatus of claim 1, wherein said cleaning chambers are disposed in such a way that said clearance extends vertically.

3. The apparatus of claim 1, wherein said chuck means rotates the substrate and reciprocates it upwardly and downwardly while the substrate is cleaned.

4. The apparatus of claim 1, the apparatus further includes a dummy plate which is disposed outside the cleaning chambers while the substrate is inside the clearance between the cleaning chambers, and is inserted into the clearance while the substrate is not inside the clearance.

5. The apparatus of claim 1, the apparatus further includes nozzle means for injecting pure water or mixed liquid including pure water and medicinal liquid into a portion of the substrate which contacts the chuck means.

6. The apparatus of claim 1, the apparatus further includes an apparatus for producing snow ice having a predetermined granular diameter and transporting the produced snow ice to the snow ice supplying means.

7. The apparatus of claim 6, wherein the snow ice producing apparatus comprising:

a chamber having an interior being thermally insulated;

cooled gas supplying means for flowing a cooled gas into the chamber;

ultra pure water supplying means for supplying interior of the chamber with ultra pure water;

discharging means for discharging the cooled gas;

pressure regulating means provided on the discharging means;

tranporting means for transporting produced snow ice to the snow ice supplying means;

temperature detecting means for measuring the temperature in the chamber; and pressure detecting means for detecting the pressure in the chamber;

whereby the pressure in the chamber is adjusted to a predetermined pressure by the temperature detecting means and the pressure detecting means, and the snow ice is produced by rotating ultra pure water along with the cooled gas like a cyclone when the temperature in the chamber is reduced to the predetermined temperature.

8. The apparatus of claim 1, wherein the screw means presses the snow ice against the opposite surfaces of the substrate under a uniform pressure force.

9. The apparatus of claim 1, wherein the number of the rotations of the screw means is controllable.

10. The apparatus of claim 1, wherein the granular diameter of the snow ice supplied by the snow ice supplying means is from between about 10 $\mu$m to about 200 $\mu$m.

11. The apparatus of claim 1, the apparatus further includes liquid temperature controlling means for controling the temperature of pure water or mixed liquid including pure water and medicinal liquid supplied by the liquid supplying means to adjust the condition of the snow ice.

* * * * *